United States Patent
Kikkawa

(10) Patent No.: US 9,224,848 B2
(45) Date of Patent: *Dec. 29, 2015

(54) COMPOUND SEMICONDUCTOR DEVICE AND MANUFACTURING METHOD OF THE SAME

(71) Applicant: Transphorm Japan, Inc., Yokohama, Kanagawa (JP)

(72) Inventor: Toshihide Kikkawa, Machida (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/561,450

(22) Filed: Dec. 5, 2014

(65) Prior Publication Data

US 2015/0078038 A1    Mar. 19, 2015

Related U.S. Application Data

(63) Continuation of application No. 13/787,788, filed on Mar. 6, 2013, now Pat. No. 8,933,489.

(30) Foreign Application Priority Data

Mar. 29, 2012   (JP) ................ 2012-077624

(51) Int. Cl.
*H01L 29/205*   (2006.01)
*H01L 29/778*   (2006.01)
(Continued)

(52) U.S. Cl.
CPC ........ *H01L 29/7787* (2013.01); *H01L 21/0254* (2013.01); *H01L 21/02458* (2013.01); *H01L 21/02518* (2013.01); *H01L 29/201* (2013.01);
(Continued)

(58) Field of Classification Search
CPC .......... H01L 29/1083; H01L 29/778–29/7801; H01L 29/66462; H01L 21/26533; H01L 29/201; H01L 29/205; H01L 29/207; H01L 29/2003; H01L 29/7787
USPC ............ 438/167, 172, 602, 604–606; 257/11, 257/200, 615, 745
See application file for complete search history.

(56) References Cited

U.S. PATENT DOCUMENTS

| 4,601,095 A | 7/1986 | Kikuchi et al. |
| 5,541,426 A | 7/1996 | Abe et al. |

(Continued)

FOREIGN PATENT DOCUMENTS

| JP | 08032113 | 2/1996 |
| JP | 2005-243727 | 9/2005 |

(Continued)

OTHER PUBLICATIONS

KIPO, Office Action dated Dec. 30, 2013, mailed in connection with counterpart Korean Patent Application No. 10-2013-33482.

*Primary Examiner* — Laura Menz
*Assistant Examiner* — Maliheh Malek
(74) *Attorney, Agent, or Firm* — Fish & Richardson P.C.

(57) ABSTRACT

An AlGaN/GaN.HEMT includes, a compound semiconductor lamination structure; a p-type semiconductor layer formed on the compound semiconductor lamination structure; and a gate electrode formed on the p-type semiconductor layer, in which Mg being an inert element of p-GaN is introduced into both sides of the gate electrode at the p-type semiconductor layer, and introduced portions of Mg are inactivated.

20 Claims, 11 Drawing Sheets

(51) Int. Cl.
 *H01L 21/02* (2006.01)
 *H02M 3/335* (2006.01)
 *H01L 29/66* (2006.01)
 *H01L 29/20* (2006.01)
 *H01L 29/207* (2006.01)
 *H01L 29/201* (2006.01)
 *H02M 1/088* (2006.01)
 *H01L 29/10* (2006.01)

(52) U.S. Cl.
 CPC .......... *H01L 29/2003* (2013.01); *H01L 29/205* (2013.01); *H01L 29/207* (2013.01); *H01L 29/66462* (2013.01); *H01L 29/778* (2013.01); *H02M 1/088* (2013.01); *H02M 3/33507* (2013.01); *H02M 3/33569* (2013.01); *H01L 21/0262* (2013.01); *H01L 21/02576* (2013.01); *H01L 21/02579* (2013.01); *H01L 29/1066* (2013.01)

(56) References Cited

U.S. PATENT DOCUMENTS

| | | | |
|---|---|---|---|
| 6,071,780 A | 6/2000 | Okamoto et al. | |
| 6,154,479 A | 11/2000 | Yoshikawa et al. | |
| 7,465,997 B2* | 12/2008 | Kinzer et al. | 257/401 |
| 7,714,350 B2 | 5/2010 | Sugawara et al. | |
| 7,728,356 B2* | 6/2010 | Suh et al. | 257/194 |
| 7,859,021 B2* | 12/2010 | Kaneko | 257/194 |
| 7,875,907 B2* | 1/2011 | Honea et al. | 257/192 |
| 8,003,452 B2 | 8/2011 | Ohki | 438/172 |
| 8,129,748 B2* | 3/2012 | Uemoto et al. | 257/192 |
| 8,198,653 B2* | 6/2012 | Imada et al. | 257/194 |
| 8,294,181 B2* | 10/2012 | Kikkawa et al. | 257/194 |
| 8,344,423 B2* | 1/2013 | Uemoto et al. | 257/192 |
| 8,513,705 B2* | 8/2013 | Kim et al. | 257/194 |
| 8,519,442 B2* | 8/2013 | Iwabuchi et al. | 257/194 |
| 8,581,335 B2* | 11/2013 | Imanishi et al. | 257/330 |
| 8,742,460 B2* | 6/2014 | Mishra et al. | 257/194 |
| 8,847,283 B2* | 9/2014 | Kamada et al. | 257/194 |
| 8,866,157 B2* | 10/2014 | Nakamura et al. | 257/77 |
| 8,883,581 B2* | 11/2014 | Ohki | 438/172 |
| 8,890,206 B2* | 11/2014 | Yamada | 257/190 |
| 8,933,489 B2* | 1/2015 | Kikkawa | 257/200 |
| 8,957,453 B2* | 2/2015 | Yamada et al. | 257/192 |
| 9,035,356 B2* | 5/2015 | Yamada | 257/194 |
| 2002/0031851 A1 | 3/2002 | Linthicum et al. | |
| 2002/0110947 A1 | 8/2002 | Sugawara et al. | |
| 2004/0113156 A1 | 6/2004 | Tamura et al. | |
| 2005/0023555 A1 | 2/2005 | Yoshida et al. | |
| 2005/0145883 A1* | 7/2005 | Beach et al. | 257/194 |
| 2005/0189561 A1 | 9/2005 | Kinzer et al. | |
| 2005/0194612 A1 | 9/2005 | Beach | |
| 2006/0060871 A1* | 3/2006 | Beach | 257/94 |
| 2006/0102926 A1* | 5/2006 | Kikkawa et al. | 257/103 |
| 2006/0214187 A1 | 9/2006 | Mita et al. | |
| 2006/0255403 A1 | 11/2006 | Asano et al. | |
| 2007/0026587 A1* | 2/2007 | Briere | 438/159 |
| 2007/0066020 A1 | 3/2007 | Beach | |
| 2007/0102727 A1* | 5/2007 | Twynam | 257/194 |
| 2007/0228473 A1* | 10/2007 | Boyd et al. | 257/353 |
| 2007/0269968 A1 | 11/2007 | Saxler et al. | |
| 2007/0284568 A1 | 12/2007 | Bito | |
| 2008/0017867 A1* | 1/2008 | Spring | 257/76 |
| 2008/0105902 A1* | 5/2008 | Twynam | 257/200 |
| 2008/0121895 A1 | 5/2008 | Sheppard et al. | |
| 2008/0157121 A1 | 7/2008 | Ohki | |
| 2008/0210977 A1* | 9/2008 | Okita | 257/197 |
| 2008/0237606 A1* | 10/2008 | Kikkawa et al. | 257/76 |
| 2008/0237640 A1 | 10/2008 | Mishra et al. | |
| 2008/0283870 A1* | 11/2008 | Sato | 257/194 |
| 2008/0290371 A1* | 11/2008 | Sheppard et al. | 257/192 |
| 2008/0290731 A1 | 11/2008 | Cassidy | |
| 2008/0296618 A1* | 12/2008 | Suh et al. | 257/190 |
| 2008/0296621 A1* | 12/2008 | Bridger et al. | 257/192 |
| 2008/0303064 A1* | 12/2008 | Sato | 257/194 |
| 2008/0308813 A1 | 12/2008 | Suh et al. | |
| 2009/0026498 A1 | 1/2009 | Matsuda | |
| 2009/0032820 A1 | 2/2009 | Chen | |
| 2009/0058532 A1* | 3/2009 | Kikkawa et al. | 330/295 |
| 2009/0072240 A1 | 3/2009 | Suh et al. | |
| 2009/0072269 A1 | 3/2009 | Suh et al. | |
| 2009/0072272 A1* | 3/2009 | Suh et al. | 257/194 |
| 2009/0078964 A1* | 3/2009 | Briere | 257/192 |
| 2009/0146185 A1 | 6/2009 | Suh et al. | |
| 2009/0189205 A1 | 7/2009 | Ohki | |
| 2009/0194793 A1* | 8/2009 | Briere | 257/201 |
| 2009/0267078 A1 | 10/2009 | Mishra et al. | |
| 2010/0012977 A1* | 1/2010 | Derluyn et al. | 257/194 |
| 2010/0044752 A1 | 2/2010 | Marui | |
| 2010/0047976 A1 | 2/2010 | Otake et al. | |
| 2010/0096668 A1* | 4/2010 | Briere | 257/194 |
| 2010/0102359 A1 | 4/2010 | Khan et al. | |
| 2010/0155720 A1* | 6/2010 | Kaneko | 257/43 |
| 2010/0155741 A1* | 6/2010 | Ohki et al. | 257/76 |
| 2010/0167478 A1* | 7/2010 | Nakazawa et al. | 438/191 |
| 2010/0187545 A1 | 7/2010 | Khan et al. | |
| 2010/0225235 A1 | 9/2010 | Nagase | |
| 2010/0244086 A1 | 9/2010 | Hanawa et al. | |
| 2010/0244104 A1 | 9/2010 | Makiyama et al. | |
| 2010/0258845 A1 | 10/2010 | Marui et al. | |
| 2010/0264461 A1 | 10/2010 | Rajan et al. | |
| 2010/0289002 A1 | 11/2010 | Lee | |
| 2010/0320505 A1* | 12/2010 | Okamoto et al. | 257/192 |
| 2011/0057232 A1 | 3/2011 | Sheppard et al. | |
| 2011/0092057 A1 | 4/2011 | Suvorov | |
| 2011/0115025 A1* | 5/2011 | Okamoto | 257/368 |
| 2011/0121314 A1* | 5/2011 | Suh et al. | 257/76 |
| 2011/0189826 A1* | 8/2011 | Mita et al. | 438/172 |
| 2011/0212582 A1 | 9/2011 | Hong et al. | |
| 2011/0217816 A1 | 9/2011 | Matsuda | |
| 2011/0227090 A1* | 9/2011 | Briere | 257/76 |
| 2011/0272740 A1 | 11/2011 | Umeda et al. | |
| 2012/0043588 A1* | 2/2012 | Iwabuchi et al. | 257/194 |
| 2012/0119261 A1 | 5/2012 | Umeda et al. | |
| 2012/0146097 A1* | 6/2012 | Endo et al. | 257/194 |
| 2012/0146728 A1* | 6/2012 | Makiyama et al. | 330/277 |
| 2012/0153355 A1 | 6/2012 | Umeda et al. | |
| 2012/0156836 A1* | 6/2012 | Shealy et al. | 438/172 |
| 2012/0175680 A1* | 7/2012 | Suh et al. | 257/194 |
| 2012/0199847 A1* | 8/2012 | Takagi | 257/77 |
| 2012/0211760 A1* | 8/2012 | Yamada | 257/76 |
| 2012/0313106 A1* | 12/2012 | He | 257/76 |
| 2012/0313109 A1* | 12/2012 | Lee | 257/76 |
| 2012/0319127 A1* | 12/2012 | Chowdhury et al. | 257/76 |
| 2013/0016345 A1* | 1/2013 | Yoshikawa et al. | 356/237.1 |
| 2013/0020614 A1* | 1/2013 | Lu et al. | 257/194 |
| 2013/0032818 A1* | 2/2013 | Nishimori et al. | 257/76 |
| 2013/0082360 A1* | 4/2013 | Miyajima et al. | 257/628 |
| 2013/0087806 A1* | 4/2013 | Ito et al. | 257/76 |
| 2013/0105810 A1* | 5/2013 | Nishimori et al. | 257/76 |
| 2013/0122669 A1* | 5/2013 | Koyama et al. | 438/167 |
| 2013/0146888 A1* | 6/2013 | Park et al. | 257/76 |
| 2013/0168685 A1* | 7/2013 | Hsu et al. | 257/76 |
| 2013/0228835 A1* | 9/2013 | Ellis-Monaghan et al. | 257/288 |
| 2013/0240893 A1 | 9/2013 | Bedell et al. | |
| 2013/0240894 A1 | 9/2013 | Wurfl et al. | |
| 2013/0242618 A1* | 9/2013 | Yamada | 363/17 |
| 2013/0248933 A1 | 9/2013 | Ikeda | |
| 2013/0256682 A1* | 10/2013 | Ishiguro et al. | 257/76 |
| 2013/0256685 A1* | 10/2013 | Ohki | 257/76 |
| 2013/0256686 A1* | 10/2013 | Kanamura | 257/76 |
| 2013/0256754 A1* | 10/2013 | Kamada | 257/194 |
| 2013/0256829 A1 | 10/2013 | Kikkawa | |
| 2013/0257539 A1* | 10/2013 | Kotani | 330/277 |
| 2013/0258719 A1 | 10/2013 | Kikkawa | |
| 2013/0271208 A1* | 10/2013 | Then et al. | 327/541 |
| 2013/0299842 A1* | 11/2013 | Prechtl et al. | 257/76 |
| 2013/0307026 A1 | 11/2013 | Hwang et al. | |
| 2013/0313563 A1* | 11/2013 | Kawasaki | 257/76 |
| 2014/0030858 A1* | 1/2014 | Beach | 438/172 |
| 2014/0091316 A1* | 4/2014 | Kikkawa | 257/76 |
| 2014/0091365 A1* | 4/2014 | Kikkawa et al. | 257/194 |
| 2014/0103399 A1* | 4/2014 | Suh et al. | 257/194 |

(56) References Cited

U.S. PATENT DOCUMENTS

| | | |
|---|---|---|
| 2014/0225161 A1* | 8/2014 | Okita et al. ............... 257/192 |
| 2014/0264364 A1* | 9/2014 | Kanamura ............... 257/76 |
| 2014/0346525 A1* | 11/2014 | Minoura et al. ............... 257/76 |
| 2014/0367744 A1* | 12/2014 | Briere ............... 257/195 |
| 2015/0041860 A1* | 2/2015 | Nishimori et al. ............... 257/194 |
| 2015/0129888 A1* | 5/2015 | Nishimori et al. ............... 257/76 |
| 2015/0162424 A1* | 6/2015 | Briere ............... 257/200 |

FOREIGN PATENT DOCUMENTS

| | | |
|---|---|---|
| JP | 2008-227073 | 9/2008 |
| JP | 2009-289827 | 12/2009 |

* cited by examiner

COMPOUND SEMICONDUCTOR DEVICE AND MANUFACTURING METHOD OF THE SAME

CROSS-REFERENCE TO RELATED APPLICATIONS

This is a continuation of U.S. application Ser. No. 13/787,788, filed on Mar. 6, 2013, which is based upon and claims the benefit of priority of the prior Japanese Application No. 2012-077624, filed on Mar. 29, 2012. The disclosure of the prior applications are considered part of and are incorporated by reference in the disclosure of this application.

FIELD

The embodiments discussed herein are directed to a compound semiconductor device and a manufacturing method of the same.

BACKGROUND

A nitride semiconductor has been considered to be applied for a high withstand voltage and high-power semiconductor device by using characteristics such as high saturation electron velocity and wide band gap. For example, a band gap of GaN being the nitride semiconductor is 3.4 eV, and it is larger than a band gap of Si (1.1 eV) and a band gap of GaAs (1.4 eV), and has high breakdown electric field intensity. Accordingly, GaN is extremely expectable as a material of a semiconductor device for a power supply in high voltage operation and obtaining high-power.

As a device using the nitride semiconductor, a lot of reports have been made as for a field effect transistor, in particular, a high electron mobility transistor (HEMT). For example, in a GaN-based HEMT (GaN-HEMT), an AlGaN/GaN.HEMT in which GaN is used as an electron transit layer and AlGaN is used as an electron supply layer attracts attention. In the AlGaN/GaN.HEMT, a distortion resulting from a difference in lattice constants between GaN and AlGaN is generated at AlGaN. High-concentration two-dimensional electron gas (2DEG) is obtained by a piezoelectric polarization generated thereby and a spontaneous polarization of AlGaN. Therefore, it is expected as a high withstand electric power device such as a high-efficiency switch element and an electric vehicle.

[Patent Literature 1] Japanese Laid-open Patent Publication No. 2009-289827

[Patent Literature 2] Japanese Laid-open Patent Publication No. 2005-243727

In a nitride semiconductor device, an art locally controlling a generation amount of the 2DEG is required. For example, in case of the HEMT, it is desired that a current does not flow when a voltage is turned off, so-called a normally-off operation from so-called a fail-safe point of view. A device is necessary to suppress the generation amount of the 2DEG at downward of a gate electrode when the voltage is turned off to enable the above.

As one of methods enabling a GaN.HEMT performing the normally-off operation, a method is proposed in which a p-type GaN layer is formed on an electron supply layer, the 2DEG existing at a portion corresponding to beneath the p-type GaN layer is ceased to be directed to the normally-off operation. In this method, p-type GaN is grown at a whole surface of, for example, on AlGaN to be the electron supply layer, the p-type GaN is dry-etched to remain at a formation portion of the gate electrode to form a p-type GaN layer, and the gate electrode is formed thereon.

As stated above, the dry-etching is used for a patterning of the p-type GaN. A surface layer of the electron supply layer disposed under the p-type GaN is damaged by the dry-etching, as a result, a sheet resistance ($R_{sh}$) and a contact resistance ($\rho_c$) increase, and an on-resistance decrease. In this case, it is impossible to obtain an enough on-current (drain current) even though a gate voltage is applied. In addition, there is a problem in which a large variation occurs at the drain current.

SUMMARY

An aspect of a semiconductor device includes: a compound semiconductor lamination structure; a p-type semiconductor layer formed at upward of the compound semiconductor lamination structure; and an electrode formed at upward of the p-type semiconductor layer, wherein an inert element is introduced into both sides of the electrode, and introduced portions of the inert element are inactivated at the p-type semiconductor layer.

An aspect of a manufacturing method of a semiconductor device includes: forming a compound semiconductor lamination structure; forming a p-type semiconductor layer at an electrode formation region at upward of the compound semiconductor lamination structure; and inactivating an introduced portion of an inert element of the p-type semiconductor layer by introducing the inert element into both sides of the electrode formation region of the p-type semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, preferred embodiments will be explained in detail with reference to accompanying drawings. In the following respective embodiments, a configuration of a compound semiconductor device is described together with a manufacturing method thereof.

Note that in the following drawings, there are components which are not illustrated as relatively accurate sizes and thicknesses as a matter of convenience of illustration.

First Embodiment

In the present embodiment, an AlGaN/GaN.HEMT is disclosed as a compound semiconductor device.

FIG. 1A to FIG. 3B are schematic sectional views illustrating a manufacturing method of an AlGaN/GaN.HEMT according to a first embodiment in process sequence.

Figure 1A:
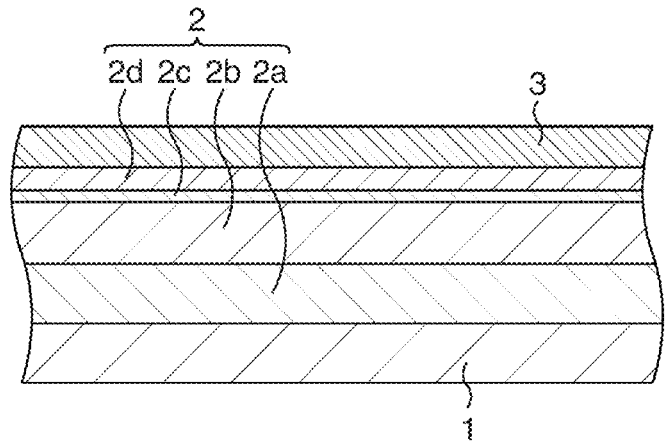
FIG. 1A to FIG. 1C are schematic sectional views illustrating a manufacturing method of an AlGaN/GaN.HEMT according to a first embodiment in process sequence.

At first, as illustrated in FIG. 1A, a compound semiconductor lamination structure 2 and a p-type semiconductor layer 3 are formed on, for example, a semi-insulating Si substrate 1 as a growth substrate. A sapphire substrate, a GaAs substrate, a SiC substrate, a GaN substrate, and so on may be used as the growth substrate instead of the Si substrate. Besides, conductivity of the substrate is either semi-insulating or conductive.

The compound semiconductor lamination structure 2 is made up by including a nucleus formation layer 2a, an electron transit layer 2b, an intermediate layer (spacer layer) 2c, and an electron supply layer 2d. A p-type semiconductor layer 3 is formed on the electron supply layer 2d.

In detail, the following respective compound semiconductors are epitaxially grown on the Si substrate 1 by, for example, a metal organic vapor phase epitaxy (MOVPE) method. A molecular beam epitaxy (MBE) method, and so on may be used instead of the MOVPE method.

The respective compound semiconductors to be the nucleus formation layer 2a, the electron transit layer 2b, the intermediate layer (spacer layer) 2c, the electron supply layer 2d, and the p-type semiconductor layer 3 are sequentially grown on the Si substrate 1. The nucleus formation layer 2a is formed by growing AlN for a thickness of, for example, approximately 0.1 μm on the Si substrate 1. The electron transit layer 2b is formed by growing i(intentionally undoped)-GaN for a thickness of, for example, approximately 300 nm. The intermediate layer 2c is formed by growing i-AlGaN for a thickness of, for example, approximately 5 nm. The electron supply layer 2d is formed by growing n-AlGaN for a thickness of approximately 30 nm. The p-type semiconductor layer 3 is formed by growing p-GaN for, for example, approximately 30 nm. There is a case in which the intermediate layer 2c is not formed. The electron supply layer may be formed by forming i-AlGaN.

Mixed gas of trimethylgallium (TMGa) gas being a Ga source and ammonia ($NH_3$) gas is used as source gas for the growth of GaN. Mixed gas of trimethylaluminum (TMAl) gas, TMGa gas, and $NH_3$ gas is used as source gas for the growth of AlGaN. Presence/absence of supply of TMAl gas, TMGa gas, TMIn gas and flow rates thereof are appropriately set in accordance with the compound semiconductor layer to be grown. The flow rate of the $NH_3$ gas being a common source is set at approximately 100 sccm to 10 slm. Besides, a growth pressure is set at approximately 50 Torr to 300 Torr, and a growth temperature is set at approximately 800° C. to 1200° C.

When AlGaN is grown as an n-type, namely when the electron supply layer 2d (n-AlGaN) is formed, an n-type impurity is added to the source gas of AlGaN. Here, for example, silane ($SiH_4$) gas containing, for example, Si is added to the source gas at a predetermined flow rate to dope Si into AlGaN. A doping concentration of Si is set at approximately $1\times10^{18}/cm^3$ to $1\times10^{20}/cm^3$, for example, at approximately $1\times10^{18}/cm^3$.

When GaN is grown as a p-type, namely, when the p-type semiconductor layer 3 (p-GaN) is formed, a p-type impurity, for example, the one selected from Mg, C is added to the source gas of GaN. In the present embodiment, Mg is used as the p-type impurity. Mg is added to the source gas at a predetermined flow rate to dope Mg into GaN. A doping concentration of Mg is, for example, set at approximately $1\times10^{16}/cm^3$ to $1\times10^{21}/cm^3$. When the doping concentration is lower than approximately $1\times10^{16}/cm^3$, GaN does not fully become the p-type, and it becomes normally-on. When the doping concentration is higher than approximately $1\times10^{21}/cm^3$, crystallinity deteriorates, and enough characteristics cannot be obtained. Accordingly, the doping concentration of Mg is set at approximately $1\times10^{16}/cm^3$ to $1\times10^{21}/cm^3$, and thereby, it becomes the p-type semiconductor capable of obtaining enough characteristics. In the present embodiment, the doping concentration of Mg of the p-type semiconductor layer 3 is set at approximately $5\times10^{19}/cm^3$.

In a compound semiconductor lamination structure 2, a piezoelectric polarization caused by the distortion resulting from a difference between a GaN lattice constant and an AlGaN lattice constant is generated at an interface between the electron transit layer 2b and the electron supply layer 2d (Accurately, an interface with the intermediate layer 2c. Hereinafter, it is referred to as a GaN/AlGaN interface) if the p-type semiconductor layer 3 is not formed. The 2DEG at high electron concentration is generated at a whole area of the GaN/AlGaN interface owing to both an effect of the piezoelectric polarization and an effect of a spontaneous polarization of the electron transit layer 2b and the electron supply layer 2d.

The p-type semiconductor layer 3 is formed on the compound semiconductor lamination structure 2, and thereby, the 2DEG at the GaN/AlGaN interface is ceased and disappeared. In FIG. 1A, an appearance in which the 2DEG is disappeared is illustrated.

Figure 1B:
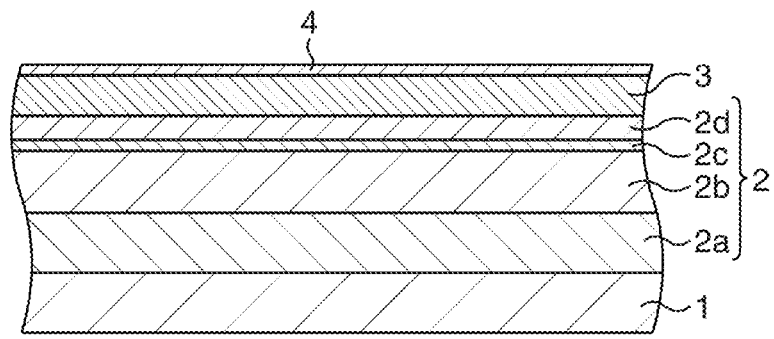

Subsequently, a protective insulating film 4 is formed as illustrated in FIG. 1B.

In detail, an insulating film, for example, a silicon nitride film (SiN film) is deposited on the p-type semiconductor layer 3 to cover it for, for example, a film thickness of approximately 40 nm by a plasma CVD method and so on. The protective insulating film 4 covering on the p-type semiconductor layer 3 is thereby formed. For example, a silicon oxide film ($SiO_2$ film) and so on may be deposited as the protective insulating film.

Figure 1C:
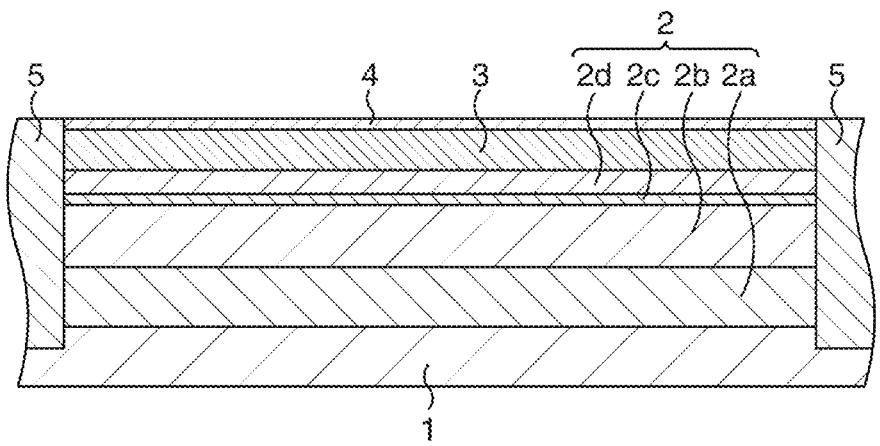

Subsequently, an element isolation structure 5 is formed as illustrated in FIG. 1C. The element isolation structure 5 is not illustrated in FIG. 2A and later.

In detail, for example, argon (Ar) is injected into an element isolation region of the compound semiconductor lamination structure 2. The element isolation structure 5 is thereby formed at the compound semiconductor lamination structure 2. An active region is defined on the compound semiconductor lamination structure 2 by the element isolation structure 5.

Note that the element isolation may be performed by using the other already known methods such as, for example, an STI (Shallow Trench Isolation) method instead of the above-stated injection method. At this time, for example, chlorine etching gas is used for the dry-etching of the compound semiconductor lamination structure 2.

Figure 2A:
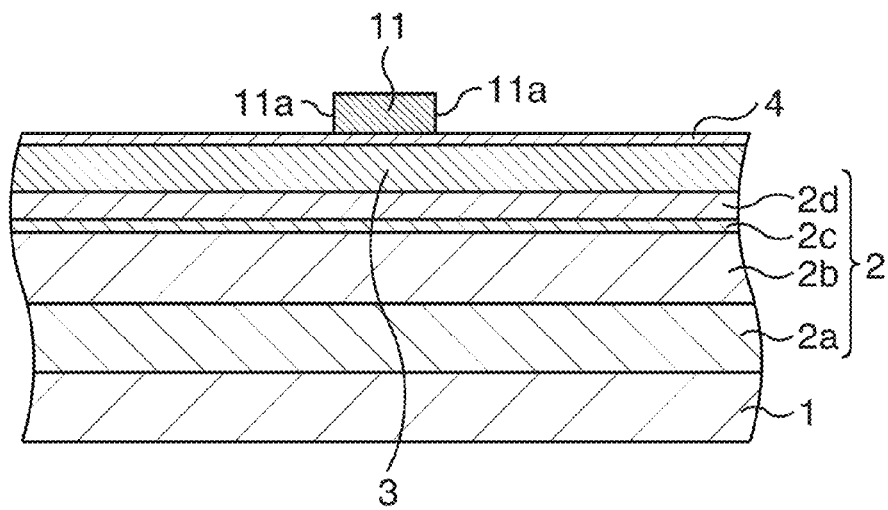
FIG. 2A and FIG. 2B are schematic sectional views illustrating the manufacturing method of the AlGaN/GaN.HEMT according to the first embodiment in process sequence subsequent to FIG. 1A to FIG. 1C.

Subsequently, a resist mask 11 is formed on the protective insulating film 4 as illustrated in FIG. 2A.

In detail, a resist is coated on the protective insulating film 4, the resist is processed by lithography, and the resist mask 11 opening at portions corresponding to both sides of a formation planned portion of a gate electrode of the protective insulating film 4 is formed. The openings of the resist mask 11 are set to be openings 11a.

Figure 2B:
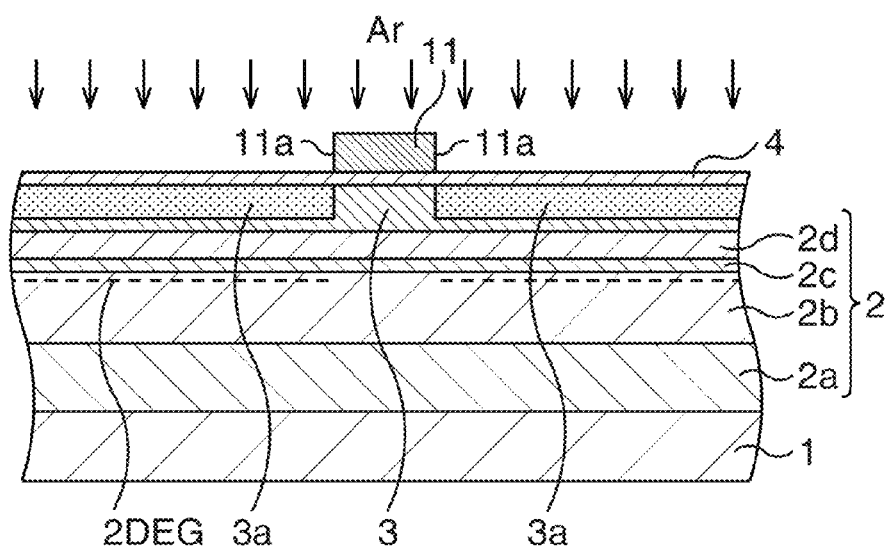

Subsequently, an inert element is introduced into the p-type semiconductor layer 3 as illustrated in FIG. 2B.

In detail, the inert element inactivating p-GaN is injected into the p-type semiconductor layer 3 by using the resist mask 11. For example, argon (Ar), iron (Fe), phosphorus (P), oxygen ($O_2$) or boron (B) or any combination thereof, here, Ar is used as the inert element. For example, Ar is injected under a condition of an acceleration energy at approximately 10 keV, and a dose amount at approximately $1 \times 10^{14}/cm^2$. Ar passes through portions of the protective insulating film 4 exposed by the openings 11a, and Ar is introduced into only the p-type semiconductor layer 3 at downward of the opening portions by the resist mask 11. Ar is introduced with the above-stated injection conditions, and thereby, Ar is introduced into surface layer portions of the p-type semiconductor layer, and non-introduced portions of Ar remain at downward of the surface layer portions. The surface layer portions of the p-type semiconductor layer 3 into which Ar is introduced are set to be Ar introduced regions 3a. The Ar introduced regions 3a are formed as stated above, and thereby, Ar remains at the surface layer portion, does not reach the electron supply layer 2d, and damages of the electron supply layer 2d caused by the injection of Ar is prevented.

The resist mask 11 is removed by an asking process, a chemical solution treatment, or the like.

Ar being the inert element inactivating p-GaN is injected into the p-type semiconductor layer 3, and thereby, the 2DEG appears again at portions positionally matching with the portions at downward of the Ar introduced regions 3a at the GaN/AlGaN interface. It is thereby possible to secure high-concentration 2DEG at a necessary portion, to effectively cease the 2DEG only at a portion positionally matching with the formation planned portion of the gate electrode, and a certain normally-off is enabled.

It is possible to use the cited substances in the above, for example, Fe instead of Ar as the inert element. Fe is a relatively heavy element, and it is possible to surely inactivate only the surface layer portion of the p-type semiconductor layer 3 with low acceleration energy.

Figure 3A:
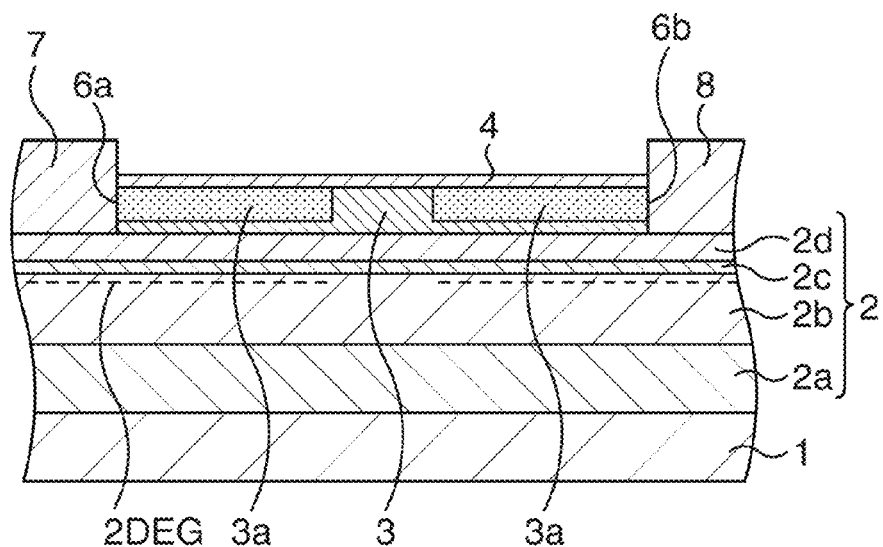
FIG. 3A and FIG. 3B are schematic sectional views illustrating the manufacturing method of the AlGaN/GaN.HEMT according to the first embodiment in process sequence subsequent to FIG. 2A and FIG. 2B.

Subsequently, a source electrode 7 and a drain electrode 8 are formed as illustrated in FIG. 3A.

In detail, at first, electrode recesses 6a, 6b are formed at formation planned portions of the source electrode and the drain electrode.

A resist is coated on a surface of the compound semiconductor lamination structure 2. The resist is processed by lithography to form openings exposing surfaces of the protective insulating film 4 corresponding to the formation planned portions of the source electrode and the drain electrode. The resist mask having the openings is thereby formed at the resist.

The formation planned portions of the source electrode and the drain electrode of the protective insulating film 4 and the p-type semiconductor layer 3 are removed by dry-etching until a surface of the electron supply layer 2d exposes by using this resist mask. The electrode recesses 6a, 6b exposing the formation planned potions of the source electrode and the drain electrode of the surface of the electron supply layer 2d are thereby formed. As etching conditions, inert gas such as Ar and chlorine gas such as $Cl_2$ are used as etching gas, and for example, it is set that a flow rate of $Cl_2$ is 30 sccm, a pressure is 2 Pa, and an RF input power is 20 W. Note that the electrode recesses 6a, 6b may be formed by etching deeper than the surface of the electron supply layer 2d.

The resist mask is removed by the asking process, the chemical solution treatment, or the like.

A resist mask to form the source electrode and the drain electrode is formed. Here, for example, a two-layer resist in eaves structure suitable for a vapor deposition method and a lift-off method is used. This resist is coated on the compound semiconductor lamination structure 2, and openings exposing the electrode recesses 6a, 6b are formed. The resist mask having the openings is thereby formed.

For example, Ta/Al is deposited as an electrode material on the resist mask including inside of the openings exposing the electrode recesses 6a, 6b by, for example, the vapor deposition method by using the resist mask. A thickness of Ta is approximately 30 nm, and a thickness of Al is approximately 200 nm. The resist mask and Ta/Al deposited thereon are removed by the lift-off method. After that, the Si substrate 1 is heat processed in, for example, nitrogen atmosphere, at a temperature of approximately 400° C. to 1000° C., for example, at approximately 600° C., and the remaining Ta/Al is brought into ohmic contact with the electron supply layer 2d. There is a case when the heat process is not necessary as long as the ohmic contact of Ta/Al with the electron supply layer 2d is obtained. The source electrode 7 and the drain electrode 8 in which the electrode recesses 6a, 6b are embedded by a part of the electrode material are thereby formed.

Figure 3B:
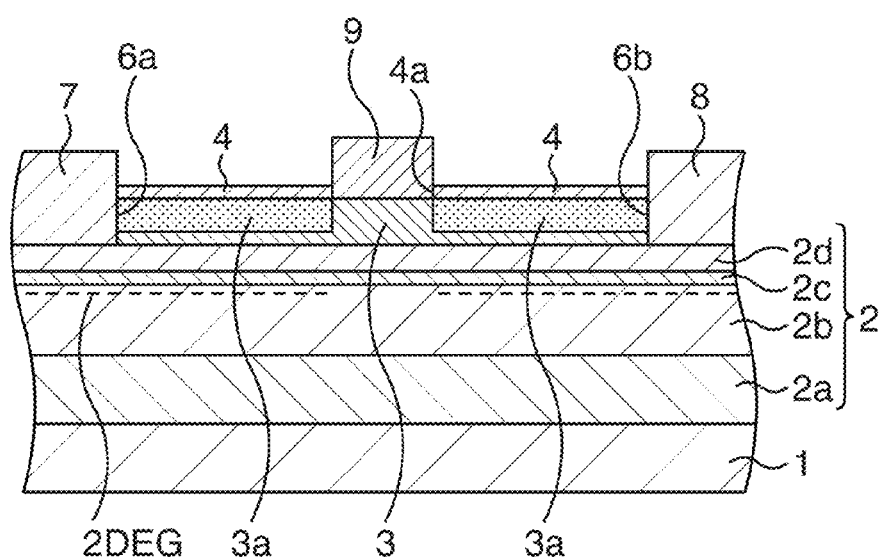

Subsequently, a gate electrode 9 is formed as illustrated in FIG. 3B.

In detail, at first, an electrode recess 6c is formed at a formation planned portion of the gate electrode.

A resist is coated on the surface of the compound semiconductor lamination structure 2. The resist is processed by lithography to form an opening exposing the surface of the protective insulating film 4 corresponding to the formation planned portion of the gate electrode at the resist. The resist mask having the opening is thereby formed.

The formation planned portion of the protective insulating film 4 is dry-etched to be removed until the surface of the p-type semiconductor layer 3 exposes by using this resist mask. An electrode recess 4a exposing the formation planned portion of the gate electrode at the surface of the p-type semiconductor layer 3 is thereby formed at the protective insulating film 4. As etching conditions thereof, the inert gas such as Ar and the chlorine gas such as $Cl_2$ are used as the etching gas, and for example, it is set that the flow rate of $Cl_2$ is 30 sccm, the pressure is 2 Pa, and the RF input power is 20 W.

The resist mask is removed by the asking process, the chemical solution treatment, or the like.

A resist mask to form the gate electrode is formed. Here, for example, the two-layer resist in eaves structure suitable for the vapor deposition method and the lift-off method is used. This resist is coated on the compound semiconductor lamination structure 2, and an opening exposing the electrode recess 4a being the formation planned portion of the gate electrode of the p-type semiconductor layer 3 is formed. The resist mask having the opening is thereby formed.

For example, Ni/Au is deposited as the electrode material on the resist mask including inside of the electrode recess 4a exposed by the opening by, for example, the vapor deposition method by using the resist mask. A thickness of Ni is approximately 30 nm, and a thickness of Au is approximately 400 nm. The resist mask and Ni/Au deposited thereon are removed by the lift-off method. The gate electrode 9 is thereby formed on a portion between the Ar introduced regions 3a at the p-type semiconductor layer 3. The gate electrode 9 is brought into Schottky contact with the p-type semiconductor layer 3.

Note that the protective insulating film 4 is used as a gate insulating film, and therefore, the gate electrode 9 may be formed on the p-type semiconductor layer 3 via the protective insulating film 4 without forming the electrode recess 4a at the protective insulating film 4. In this case, an MIS type AlGaN/GaN.HEMT is formed.

After that, the AlGaN/GaN.HEMT according to the present embodiment is formed by going through respective processes such as formation of wirings to be connected to the source electrode 7, the drain electrode 8, and the gate electrode 9.

Figure 4:
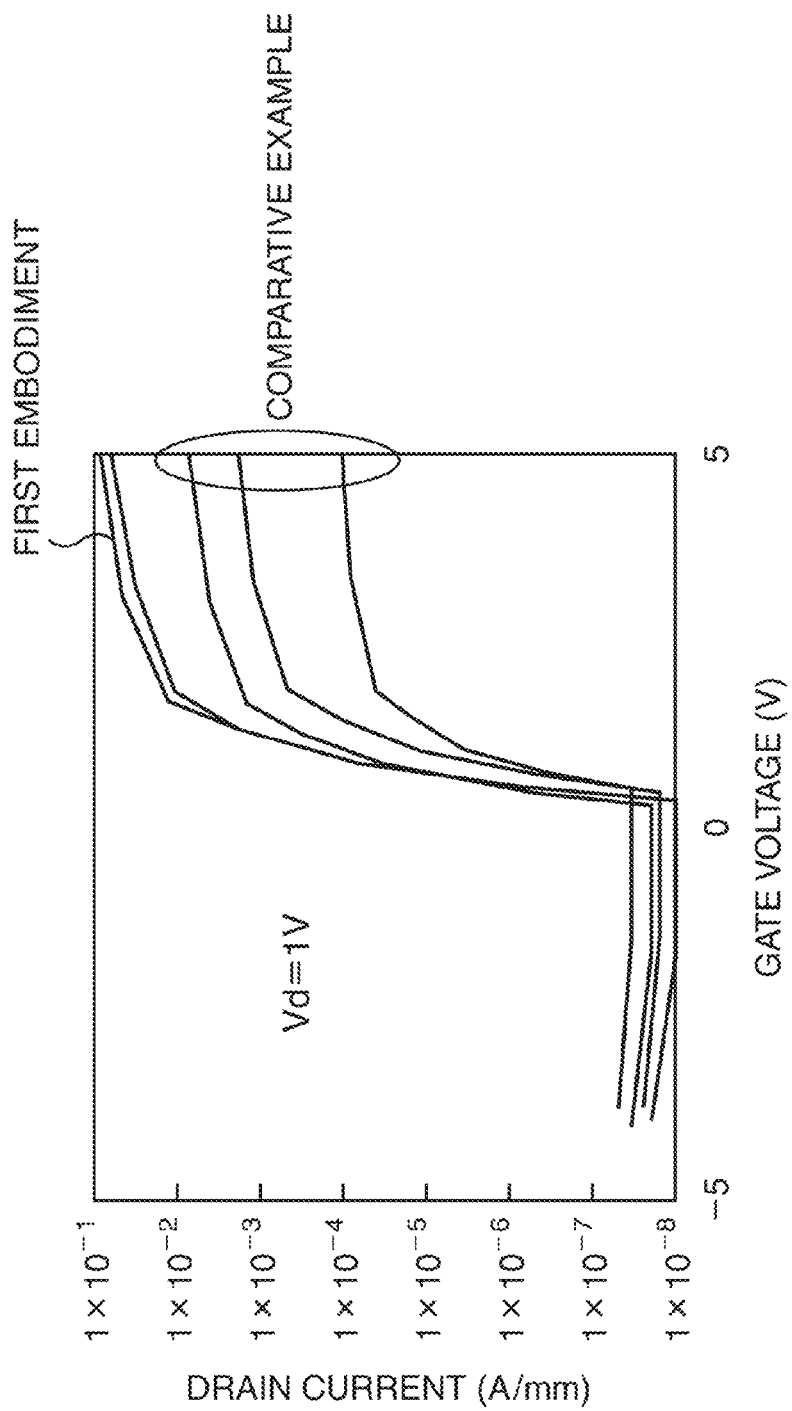
FIG. 4 is a characteristics chart representing a relationship between a gate voltage and a drain current at the AlGaN/GaN.HEMT.

A relationship between a gate voltage and a drain current is investigated as for the AlGaN/GaN.HEMT according to the present embodiment based on a comparison with an AlGaN/GaN.HEMT according to a comparative example. The result thereof is represented in FIG. 4. In the AlGaN/GaN.HEMT according to the comparative example, the introduction of the inert element according to the present embodiment is not performed, and a gate electrode is formed on a p-type semiconductor layer patterned by dry-etching. Plural samples of the manufactured AlGaN/GaN.HEMTs are studied as objects as for both the present embodiment and the comparative example.

As represented in FIG. 4, it is verified that values of the drain currents are low and a large variation occurs in the drain currents by each sample in the comparative example. On the other hand, the values of the drain currents are higher than the comparative example, and the variation seldom occurs in the drain currents by each sample in the present embodiment.

In the AlGaN/GaN.HEMTs according to the comparative example, AlGaN of the electron supply layer is largely damaged by the dry-etching of the p-type semiconductor layer, and thereby, the drain current extremely decreases. Besides, a control of the dry-etching of the p-type semiconductor layer is difficult, and etching states (for example, etching amounts of AlGaN of the electron supply layer) are different by each product, and thereby, the variation of the drain currents occurs.

In the AlGaN/GaN.HEMT according to the present embodiment, only the necessary 2DEG is resumed by injecting the inert element without performing the dry-etching of the p-type semiconductor layer. In the injection of the inert element, it is possible to accurately inject the inert element at a desired concentration into a desired region. Accordingly, it is possible to perform the injection of the inert element without damaging AlGaN of the electron supply layer and without any variation by each product. It is thereby possible to obtain the AlGaN/GaN.HEMT of which value of the drain current is high and without almost any variation in the drain current in the present embodiment.

As stated above, the AlGaN/GaN.HEMT with high reliability in which the device characteristics are improved by securing the stable and large drain current without any variation, and the certain normally-off is enabled is enabled in the present embodiment.

Modification Example

Hereinafter, a modification example of the first embodiment is described. In the modification example, an AlGaN/GaN.HEMT similar to the first embodiment is disclosed, but it is different from the first embodiment in a point in which a manufacturing method thereof is partly different.

FIGS. 5A, 5B and FIGS. 6A, 6B are schematic sectional views illustrating main processes in a manufacturing method of the AlGaN/GaN.HEMT according to the modification example of the first embodiment. Note that the same reference numerals are used to designate similar components and so on as the first embodiment, and detailed description thereof is not given.

In the modification example, at first, the element isolation structure 5 is formed by the process of FIG. 1C after the compound semiconductor lamination structure 2 and the p-type semiconductor layer 3 are formed by the process of FIG. 1A of the first embodiment.

Figure 5A:
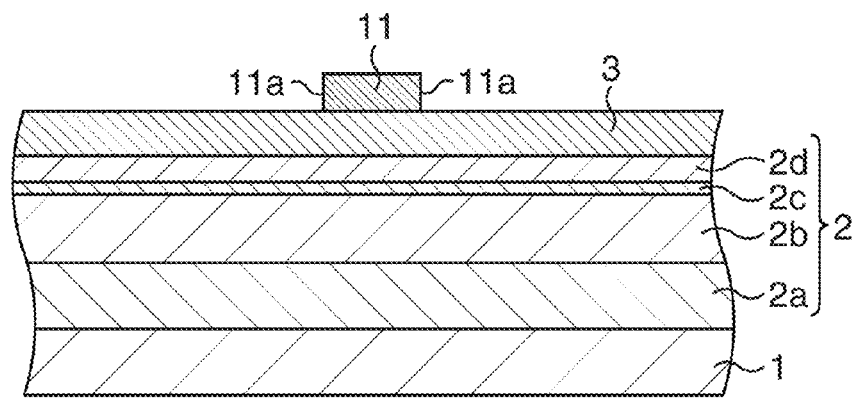
FIG. 5A and FIG. 5B are schematic sectional views illustrating a manufacturing method of an AlGaN/GaN.HEMT according to a modification example of the first embodiment in process sequence.

Subsequently, the resist mask 11 is formed on the p-type semiconductor layer 3 as illustrated in FIG. 5A.

In detail, the resist is coated on the p-type semiconductor layer 3, the resist is processed by lithography, and the resist mask 11 opening at portions corresponding to both sides of the formation planned portion of the gate electrode of the p-type semiconductor layer 3 is formed. The openings of the resist mask 11 are set to be the openings 11a.

Figure 5B:
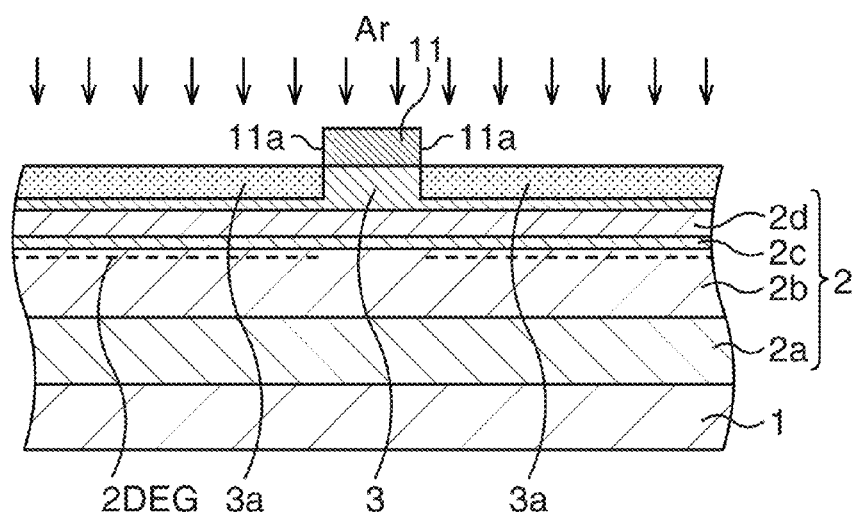

Subsequently, the inert element is introduced into the p-type semiconductor layer 3 as illustrated in FIG. 5B.

In detail, the inert element inactivating p-GaN is directly injected into the p-type semiconductor layer 3 by using the resist mask 11. For example, argon (Ar), iron (Fe), phosphorus (P), oxygen ($O_2$) or boron (B) or any combination thereof, here, Ar is used as the inert element. For example, Ar is injected under a condition of an acceleration energy at approximately 15 keV, and a dose amount at approximately $1\times10^{14}/cm^2$. Ar is introduced into only at portions of the p-type semiconductor layer 3 exposed by the openings 11a by the resist mask 11. Ar is introduced with the above-stated injection conditions, and thereby, Ar is introduced into the surface layer portions of the p-type semiconductor layer, and the non-introduced portions of Ar remain at downward of the surface layer portions. The surface layer portions of the p-type semiconductor layer 3 into which Ar is introduced are set to be the Ar introduced regions 3a. The Ar introduced regions 3a are formed as stated above, and thereby, Ar remains at the surface layer portion, does not reach the electron supply layer 2d, and damages of the electron supply layer 2d caused by the injection of Ar is prevented.

The resist mask 11 is removed by the asking process, the chemical solution treatment, or the like.

Ar being the inert element inactivating p-GaN is injected into the p-type semiconductor layer 3, and thereby, the 2DEG appears again at the portions positionally matching with the portions at downward of the Ar introduced regions 3a at the GaN/AlGaN interface. It is thereby possible to secure the high-concentration 2DEG at the necessary portion, and to effectively cease the 2DEG only at the portion positionally matching with the formation planned portion of the gate electrode, and thereby, the certain normally-off is enabled.

It is possible to use the cited substances in the above, for example, Fe instead of Ar as the inert element. Fe is the relatively heavy element, and it is possible to surely inactivate only the surface layer portion of the p-type semiconductor layer 3 with low acceleration energy.

The resist mask 11 is removed by the asking process, the chemical solution treatment, or the like.

Figure 6A:
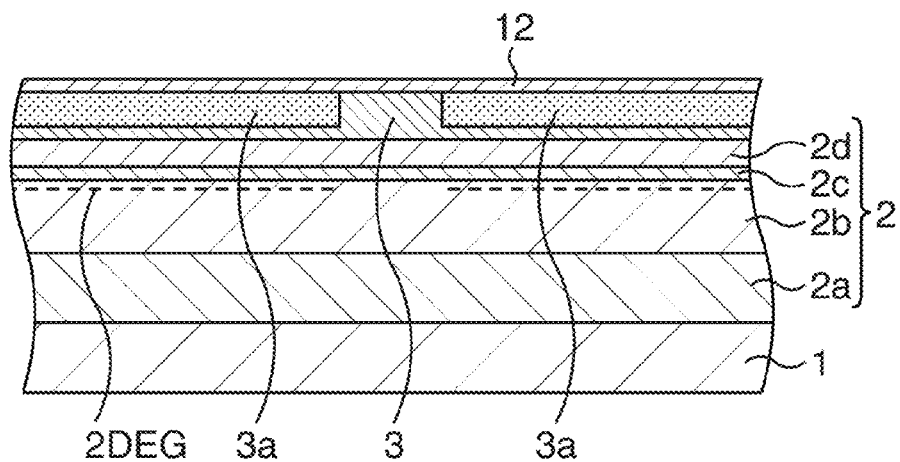
FIG. 6A and FIG. 6B are schematic sectional views illustrating the manufacturing method of the AlGaN/GaN.HEMT according to the modification example of the first embodiment in process sequence subsequent to FIG. 5A and FIG. 5B.

Subsequently, a protective insulting film 12 is formed as illustrated in FIG. 6A.

In detail, an insulating film, for example, a silicon nitride film (SiN film) is deposited on the p-type semiconductor layer 3 to cover it for, for example, a film thickness of approximately 40 nm by a plasma CVD method and so on. The protective insulating film 12 covering the p-type semiconductor layer 3 is thereby formed. As the protective insulating film, for example, a silicon oxide film ($SiO_2$ film) and so on may be deposited.

Figure 6B:
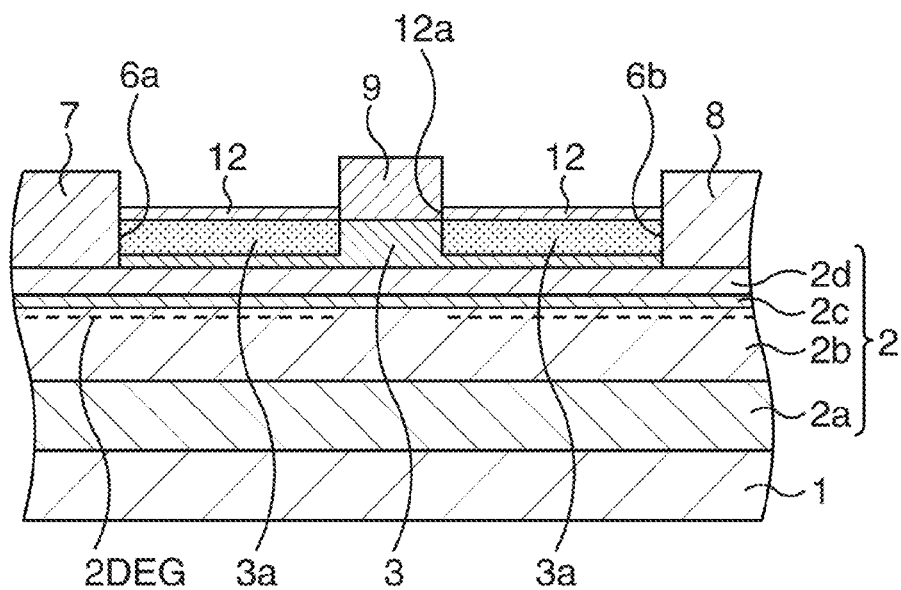

After that, the source electrode 7, the drain electrode 8, and the gate electrode 9 are formed as illustrated in FIG. 6B by performing the processes in FIG. 3A and FIG. 3B.

Note that the protective insulating film 12 is used as a gate insulating film, and therefore, the gate electrode 9 may be formed on the p-type semiconductor layer 3 via the protective insulating film 12 without forming the electrode recess at the protective insulating film 12. In this case, the MIS type AlGaN/GaN.HEMT is formed.

After that, the AlGaN/GaN.HEMT according to the modification example is formed by going through respective processes such as formation of wirings to be connected to the source electrode 7, the drain electrode 8, and the gate electrode 9.

In the modification example, the AlGaN/GaN.HEMT with high reliability is enabled in which the device characteristics are improved by securing the stable and large drain current without any variation, and the certain normally-off is enabled.

The AlGaN/GaN.HEMT according to the first embodiment or the modification example is applied to so-called a discrete package.

In this discrete package, a chip of the AlGaN/GaN.HEMT according to the first embodiment or the modification example is mounted. Hereinafter, the discrete package of the chip of the AlGaN/GaN.HEMT according to the first embodiment or the modification example (hereinafter, referred to as an HEMT chip) is exemplified.

Figure 7:
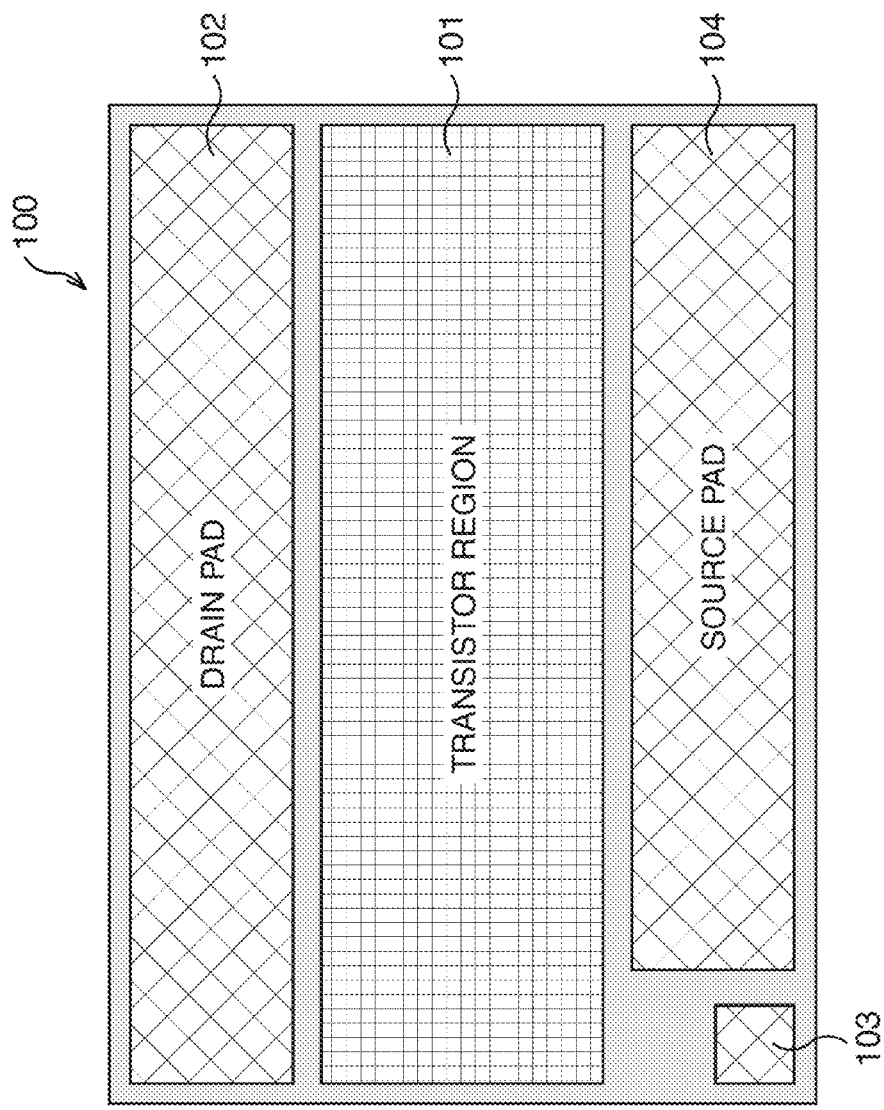
FIG. 7 is a schematic plan view illustrating an HEMT chip using the AlGaN/GaN.HEMT according to the first embodiment or the modification example.

A schematic configuration of the HEMT chip is illustrated in FIG. 7.

In an HEMT chip 100, a transistor region 101 of the AlGaN/GaN.HEMT, a drain pad 102 to which the drain electrode is connected, a gate pad 103 to which the gate electrode is connected, and a source pad 104 to which the source electrode is connected are provided at a surface thereof.

Figure 8:
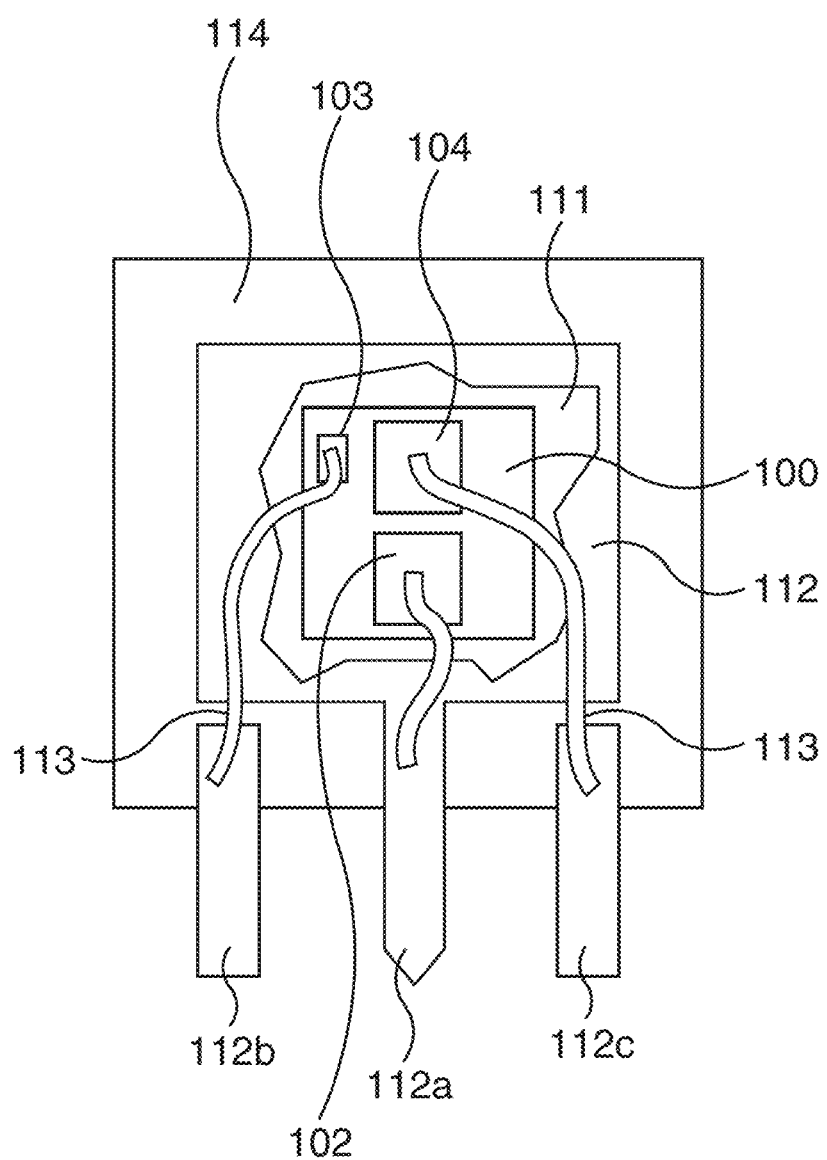
FIG. 8 is a schematic plan view illustrating a discrete package of the HEMT chip using the AlGaN/GaN.HEMT according to the first embodiment or the modification example.

FIG. 8 is a schematic plan view illustrating the discrete package.

At first, the HEMT chip 100 is fixed to a lead frame 112 by using a die attach agent 111 such as a solder to manufacture the discrete package. A drain lead 112a is integrally formed at the lead frame 112, and a gate lead 112b and a source lead 112c are disposed apart from the lead frame 112 as individual bodies.

Subsequently, the drain pad 102 and the drain lead 112a, the gate pad 103 and the gate lead 112b, and the source pad 104 and the source lead 112c are each electrically connected by a bonding using Al wires 113.

After that, the HEMT chip 100 is resin-sealed by a transfer molding method by using a molding resin 114, and the lead frame 112 is detached. The discrete package is thereby formed.

Second Embodiment

In the present embodiment, a PFC (Power Factor Correction) circuit including the AlGaN/GaN.HEMT according to one kind selected from the first embodiment and the modification example is disclosed.

Figure 9:
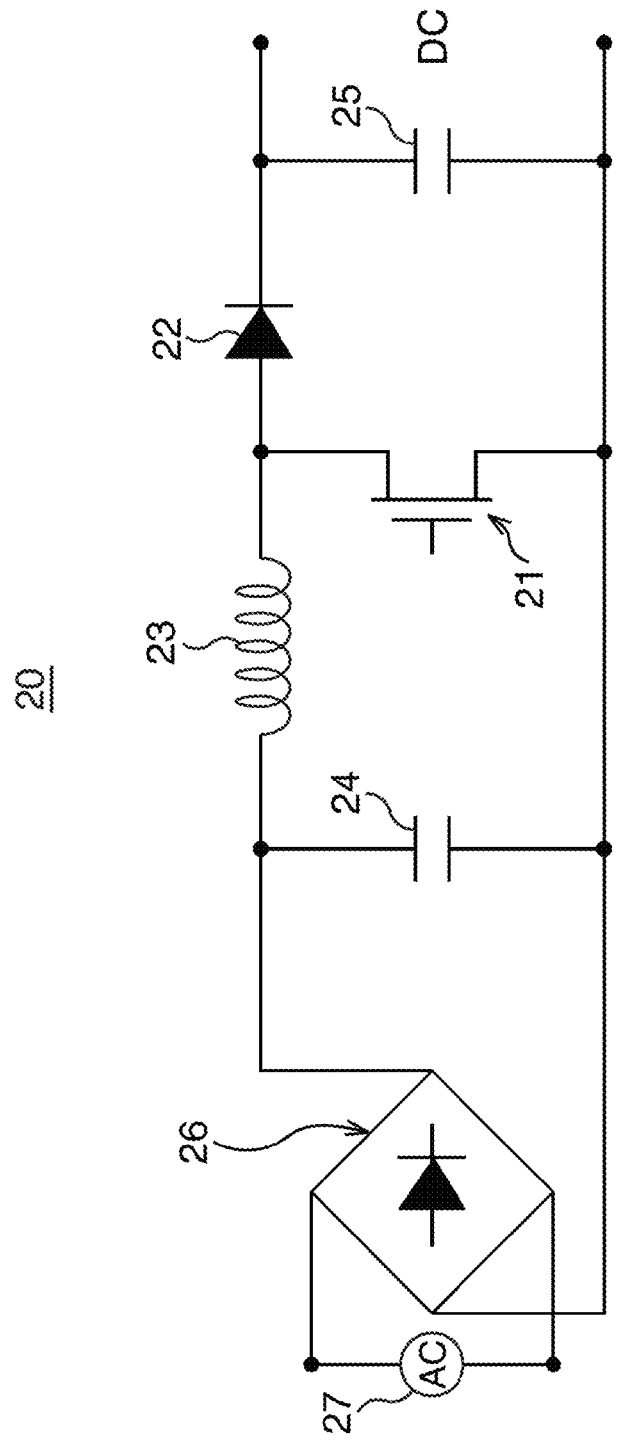
FIG. 9 is a connection diagram illustrating a PFC circuit according to a second embodiment.

FIG. 9 is a connection diagram illustrating the PFC circuit.

A PFC circuit 20 is made up by including a switch element (transistor) 21, a diode 22, a choke coil 23, capacitors 24, 25, a diode bridge 26, and an alternating-current power supply (AC) 27. The AlGaN/GaN.HEMT according to one kind selected from the first embodiment and the modification example is applied for the switch element 21.

In the PFC circuit 20, a drain electrode of the switch element 21, an anode terminal of the diode 22 and one terminal of the choke coil 23 are connected. A source electrode of the switch element 21, one terminal of the capacitor 24 and one terminal of the capacitor 25 are connected. The other terminal of the capacitor 24 and the other terminal of the choke coil 23 are connected. The other terminal of the capacitor 25 and a cathode terminal of the diode 22 are connected. The AC 27 is connected between both terminals of the capacitor 24 via the diode bridge 26. A direct-current power supply (DC) is connected between both terminals of the capacitor 25. Note that a not-illustrated PFC controller is connected to the switch element 21.

In the present embodiment, the AlGaN/GaN.HEMT according to one kind selected from the first embodiment and the modification example is applied for the PFC circuit 20. A high reliability PFC circuit 20 is thereby enabled.

Third Embodiment

In the present embodiment, a power supply device including the AlGaN/GaN.HEMT according to one kind selected from the first embodiment and the modification example is disclosed.

Figure 10:
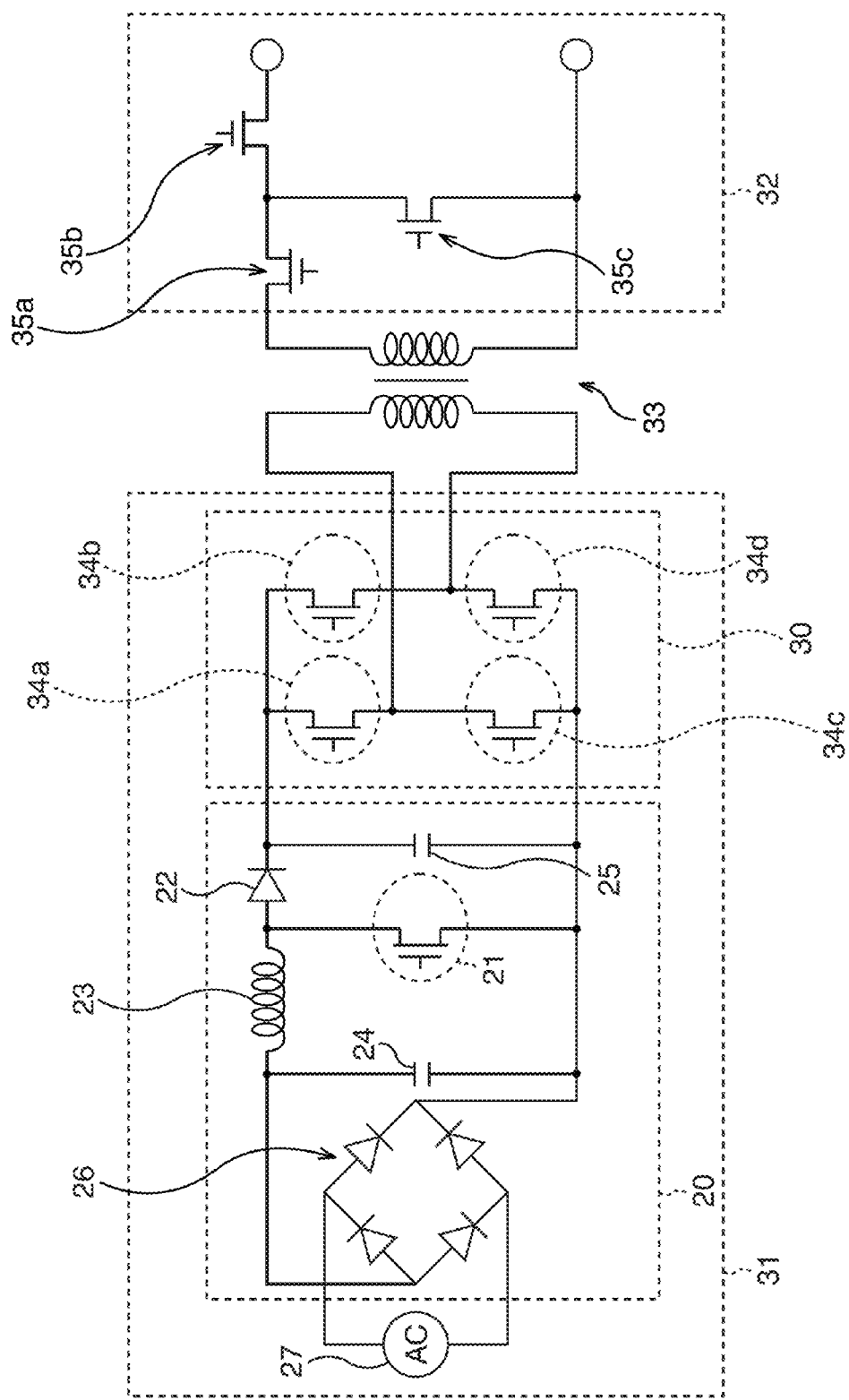
FIG. 10 is a connection diagram illustrating a schematic configuration of a power supply device according to a third embodiment.

FIG. 10 is a connection diagram illustrating a schematic configuration of the power supply device according to a third embodiment.

The power supply device according to the present embodiment is made up by including a high-pressure primary side circuit 31, a low-pressure secondary side circuit 32, and a transformer 33 disposed between the primary side circuit 31 and the secondary side circuit 32.

The primary side circuit 31 includes the PFC circuit 20 according to the second embodiment, and an inverter circuit connected between the both terminals of the capacitor 25 of the PFC circuit 20, for example, a full-bridge inverter circuit 30. The full-bridge inverter circuit 30 is made up by including plural (here, four pieces of) switch elements 34a, 34b, 34c, and 34d.

The secondary side circuit 32 is made up by including plural (here, three pieces of) switch elements 35a, 35b, and 35c.

In the present embodiment, the PCF circuit constituting the primary side circuit 31 is the PFC circuit 20 according to the second embodiment, and the switch elements 34a, 34b, 34c, and 34d of the full-bridge inverter circuit 30 are the AlGaN/GaN.HEMTs according to one kind selected from the first embodiment and the modification example. On the other hand, the switch elements 35a, 35b, and 35c of the secondary side circuit 32 are normal MIS.FETs using silicon.

In the present embodiment, the PFC circuit 20 according to the second embodiment and the AlGaN/GaN.HEMTs according to one kind selected from the first embodiment or the modification example are applied for the primary side circuit 31 being the high-pressure circuit. A high-reliability and high-power power supply device is thereby enabled.

Fourth Embodiment

In the present embodiment, a high-frequency amplifier including the AlGaN/GaN.HEMT according to one kind selected from the first embodiment and the modification example is disclosed.

Figure 11:
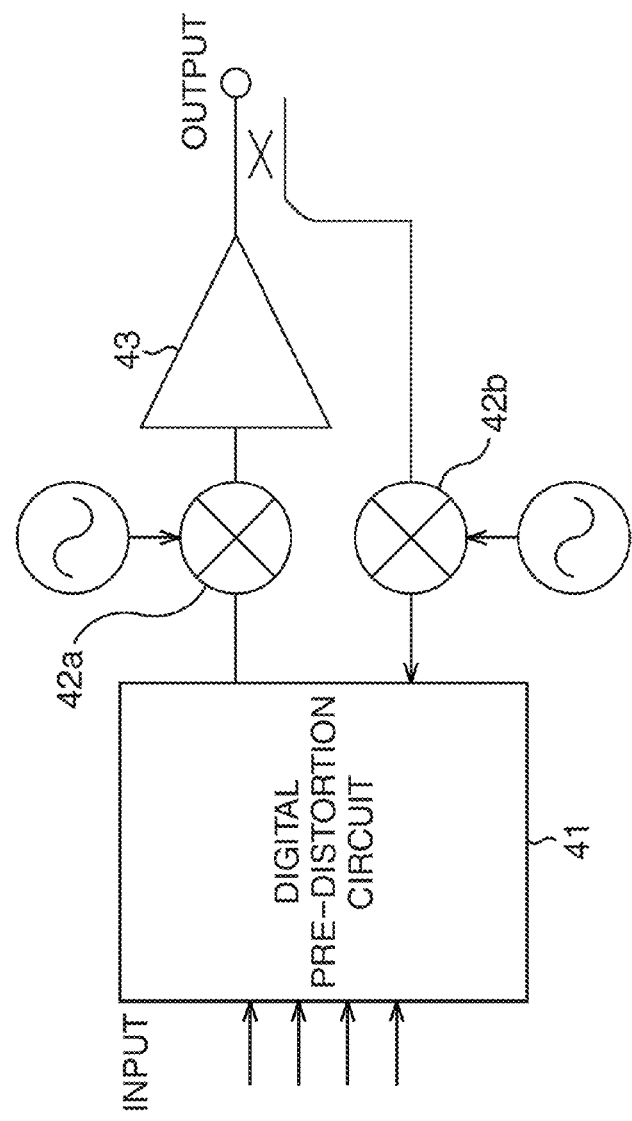
FIG. 11 is a connection diagram illustrating a schematic configuration of a high-frequency amplifier according to a fourth embodiment.

FIG. 11 is a connection diagram illustrating a schematic configuration of the high-frequency amplifier according to a fourth embodiment.

The high-frequency amplifier according to the present embodiment is made up by including a digital pre-distortion circuit 41, mixers 42a, 42b, and a power amplifier 43.

The digital pre-distortion circuit 41 is to compensate a nonlinear distortion of an input signal. The mixer 42a is to mix the input signal of which nonlinear distortion is compensated with an AC signal. The power amplifier 43 is to amplify the input signal mixed with the AC signal, and includes the AlGaN/GaN.HEMT according to one kind selected from the first embodiment and the modification example. Note that in FIG. 11, it is constituted such that a signal at an output side is able to be mixed with the AC signal by the mixer 42b and to transmit to the digital pre-distortion circuit 41 by, for example, a switching of a switch.

In the present embodiment, the AlGaN/GaN.HEMT according to one kind selected from the first embodiment and the modification example is applied for the high-frequency amplifier. The high reliability, high withstand voltage, and high-frequency amplifier is thereby enabled.

Other Embodiments

In the first embodiment and the modification example, the AlGaN/GaN.HEMT is exemplified as the compound semiconductor device. It is applicable for the following HEMTs other than the AlGaN/GaN.HEMT as the compound semiconductor device.

The Other Device Example 1

In the present example, an InAlN/GaN.HEMT is disclosed as the compound semiconductor device.

InAlN and GaN are compound semiconductors capable of approximating lattice constants by compositions thereof. In this case, the electron transit layer is formed by i-GaN, the intermediate layer is formed by AlN, the electron supply layer is formed by n-InAlN, and the p-type semiconductor layer is formed by p-GaN in the first embodiment and the modification example. Besides, the piezoelectric polarization is seldom generated in this case, and therefore, the two-dimensional electron gas is mainly generated by the spontaneous polarization of InAlN.

According to the present example, a high reliability InAlN/GaN.HEMT improving the device characteristics by securing the stable and large drain current without any variation, and enabling the certain normally-off is enabled as same as the above-stated AlGaN/GaN.HEMT.

The Other Device Example 2

In the present example, an InAlGaN/GaN.HEMT is disclosed as the compound semiconductor device.

GaN and InAlGaN are compound semiconductors capable of making the lattice constant of the latter one smaller than the former one by compositions thereof. In this case, the electron transit layer is formed by i-GaN, the intermediate layer is formed by i-InAlGaN, the electron supply layer is formed by n-InAlGaN, and the p-type semiconductor layer is formed by p-GaN in the first embodiment and the modification example.

According to the present example, a high reliability InAlGaN/GaN.HEMT improving the device characteristics by securing the stable and large drain current without any variation, and enabling the certain normally-off is enabled as same as the above-stated AlGaN/GaN.HEMT.

According to each aspect, a high reliability compound semiconductor device improving device characteristics by securing a stable and large drain current without any variation, and enabling a certain normally-off is enabled.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a compound semiconductor lamination structure including a nitride semiconductor;
   a p-type nitride semiconductor layer formed upward of the compound semiconductor lamination structure; and
   a gate electrode formed upward of the p-type nitride semiconductor layer,
   wherein the p-type nitride semiconductor layer includes portions on opposite sides of the gate electrode in which inert elements have been introduced, the inert elements causing the portions of the p-type nitride semiconductor layer to be inactivated, and resulting in the presence of a two-dimensional electron gas in regions of the compound semiconductor lamination structure that are below the portions of the p-type nitride semiconductor layer on opposite sides of the gate electrode but not in a region of the compound semiconductor lamination structure that is below the gate electrode.

2. The compound semiconductor device according to claim 1, wherein the nitride semiconductor includes a layer of GaN and a layer of AlGaN, and the two-dimensional electron gas is in the layer of GaN.

3. The compound semiconductor device according to claim 2, wherein the nitride semiconductor further includes a layer of AlN between the layer of GaN and the layer of AlGaN.

4. The compound semiconductor device according to claim 1, further comprising a protective insulating film that covers the portions of the p-type nitride semiconductor layer on opposite sides of the gate electrode.

5. The compound semiconductor device according to claim 1, wherein the inert elements comprise argon (Ar), iron (Fe), phosphorus (P), oxygen ($O_2$) or boron (B) or any combination thereof.

6. The compound semiconductor device according to claim 1, wherein the p-type nitride semiconductor layer comprises GaN.

7. The compound semiconductor device according to claim 1, wherein the device comprises a source electrode and a drain electrode on opposite sides of the gate electrode, and the portions of the p-type nitride semiconductor layer containing the inert element each extend from the gate electrode to the source or drain electrode.

8. A method of manufacturing a compound semiconductor device, comprising:

forming a compound semiconductor lamination structure which includes a nitride semiconductor;

forming a p-type nitride semiconductor layer upward of the compound semiconductor lamination structure;

forming a gate electrode upward of the p-type semiconductor layer; and introducing inert elements into portions of the p-type nitride semiconductor layer on opposite sides of the gate electrode, thereby causing the portions of the p-type nitride semiconductor layer to be inactivated and resulting in the presence of a two-dimensional electron gas in regions of the compound semiconductor lamination structure that are below the portions of the p-type nitride semiconductor layer but not in a region of the compound semiconductor lamination structure that is directly below the gate electrode.

9. The method of manufacturing the compound semiconductor device according to claim 8, wherein the nitride semiconductor includes a layer of GaN and a layer of AlGaN, and the two-dimensional electron gas is in the layer of GaN.

10. The method of manufacturing the compound semiconductor device according to claim 9, wherein the nitride semiconductor further includes a layer of AlN between the layer of GaN and the layer of AlGaN.

11. The method of manufacturing the compound semiconductor device according to claim 8, further comprising forming a protective insulating film on the p-type nitride semiconductor layer, wherein the inert elements are introduced into the p-type nitride semiconductor layer through the protective insulating film.

12. The method of manufacturing the compound semiconductor device according to claim 8, further comprising forming a protective insulating film that covers the portions of the p-type nitride semiconductor layer on opposite sides of the gate electrode after the introducing of the inert elements into the p-type nitride semiconductor layer.

13. The method of manufacturing the compound semiconductor device according to claim 8, wherein the inert elements comprise argon (Ar), iron (Fe), phosphorus (P), oxygen ($O_2$) or boron (B) or any combination thereof.

14. The method of manufacturing the compound semiconductor device according to claim 8, further comprising forming a source electrode and a drain electrode on opposite sides of the gate electrode, wherein the portions of the p-type nitride semiconductor layer containing the inert element each extend from the gate electrode to the source or drain electrode.

15. A power supply device, comprising:

a transformer;

a high-pressure circuit and a low-pressure circuit that sandwich the transformer therebetween, wherein the high-pressure circuit includes a transistor, and the transistor includes:

a compound semiconductor lamination structure which includes a nitride semiconductor;

a p-type nitride semiconductor layer formed upward of the compound semiconductor lamination structure; and a gate electrode formed upward of the p-type nitride semiconductor layer, wherein the p-type nitride semiconductor layer includes portions on opposite sides of the gate electrode in which inert elements have been introduced, the inert elements causing the portions of the p-type nitride semiconductor layer to be inactivated, and resulting in the presence of a two-dimensional electron gas in regions of the compound semiconductor lamination structure that are below the portions of the p-type nitride semiconductor layer on opposite sides of the gate electrode but not in a region of the compound semiconductor lamination structure that is below the gate electrode.

16. The power supply device according to claim 15, wherein the nitride semiconductor includes a layer of GaN and a layer of AlGaN, and the two-dimensional electron gas is in the layer of GaN.

17. The power supply device according to claim 16, wherein the nitride semiconductor further includes a layer of AlN between the layer of GaN and the layer of AlGaN.

18. The power supply device according to claim 15, further comprising a protective insulating film that covers the portions of the p-type nitride semiconductor layer on opposite sides of the gate electrode.

19. The power supply device according to claim 15, wherein the p-type nitride semiconductor layer comprises GaN.

20. The power supply device according to claim 15, wherein the transistor further includes a source electrode and a drain electrode on opposite sides of the gate electrode, and the portions of the p-type nitride semiconductor layer containing the inert element each extend from the gate electrode to the source or drain electrode.

* * * * *